(12) United States Patent
Chiriac et al.

(10) Patent No.: US 9,148,979 B2
(45) Date of Patent: Sep. 29, 2015

(54) HEAT DISSIPATING APPARATUS FOR FOLDING ELECTRONIC DEVICES

(71) Applicant: QUALCOMM Incorporated, San Diego, CA (US)

(72) Inventors: Victor A. Chiriac, San Diego, CA (US); Dexter T. Chun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 276 days.

(21) Appl. No.: 13/706,492

(22) Filed: Dec. 6, 2012

(65) Prior Publication Data
US 2014/0098489 A1 Apr. 10, 2014

Related U.S. Application Data

(60) Provisional application No. 61/711,192, filed on Oct. 8, 2012.

(51) Int. Cl.
| | |
|---|---|
| *H05K 7/20* | (2006.01) |
| *G06F 1/20* | (2006.01) |
| *H05K 13/04* | (2006.01) |
| *H01L 23/473* | (2006.01) |

(52) U.S. Cl.
CPC ............ *H05K 7/20436* (2013.01); *G06F 1/203* (2013.01); *G06F 1/206* (2013.01); *H05K 13/04* (2013.01); *G06F 2200/203* (2013.01); *Y10T 29/49117* (2015.01)

(58) Field of Classification Search
CPC ...................... H05K 7/20218–7/20381; H05K 7/20409–7/20418; H05K 7/20009–7/202; H01L 23/473; H01L 23/367–23/3677; H01L 23/46–23/467; G06F 1/181–1/182

USPC ........................ 361/679.46–679.54, 688–723, 361/676–678; 165/80.1–80.5, 104.33, 185; 174/15.1–15.3, 16.1–16.3, 547–548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 5,757,615 | A | * 5/1998 | Donahoe et al. | ......... 361/679.47 |
| 5,828,552 | A | 10/1998 | Ma | |
| 5,847,925 | A | 12/1998 | Progl et al. | |
| 5,880,929 | A | * 3/1999 | Bhatia | ...................... 361/679.27 |

(Continued)

OTHER PUBLICATIONS

International Search Report and Written Opinion—PCT/US2013/063806—ISA/EPO—Dec. 5, 2013.

*Primary Examiner* — Anthony Haughton
*Assistant Examiner* — Razmeen Gafur
(74) *Attorney, Agent, or Firm* — Michelle S. Gallardo

(57) ABSTRACT

Some implementations provide a folding electronic device that includes a base portion, a cover portion and a coupler. The base portion includes a region configured to generate heat. The cover portion includes a display screen, a heat dissipating component, and a thermally insulating component. The heat dissipating component is coplanar to the display screen. The thermally insulating component is coplanar to the display screen. The thermally insulating component is located between the display screen and the heat dissipating component. The coupler is for thermally coupling the base portion to the cover portion. The coupler includes a first component and a second component. The first component is coupled to the region configured to generate heat. The second component is coupled to the heat dissipating component of the cover portion. The coupler provides a path for transferring heat.

39 Claims, 16 Drawing Sheets

Heat Path

(56) References Cited

U.S. PATENT DOCUMENTS

| | | | |
|---|---|---|---|
| 6,038,128 A * | 3/2000 | Hood et al. | 361/679.41 |
| 6,078,499 A * | 6/2000 | Mok | 361/679.52 |
| 6,175,493 B1 * | 1/2001 | Gold | 361/679.47 |
| 6,507,488 B1 * | 1/2003 | Cipolla et al. | 361/679.52 |
| 6,507,493 B2 * | 1/2003 | Ueda et al. | 361/704 |
| 6,515,857 B2 * | 2/2003 | Ford et al. | 361/679.53 |
| 7,086,452 B1 * | 8/2006 | Senyk et al. | 165/80.4 |
| 7,161,803 B1 * | 1/2007 | Heady | 361/700 |
| 7,656,665 B2 | 2/2010 | Lin et al. | |
| 7,746,631 B2 | 6/2010 | Ali | |
| 7,907,397 B2 | 3/2011 | Hung et al. | |
| 2002/0172005 A1 * | 11/2002 | Ford et al. | 361/687 |
| 2004/0001310 A1 * | 1/2004 | Chu et al. | 361/687 |
| 2004/0070942 A1 * | 4/2004 | Tomioka et al. | 361/700 |
| 2004/0080908 A1 * | 4/2004 | Wang et al. | 361/687 |
| 2004/0130869 A1 | 7/2004 | Fleck et al. | |
| 2005/0039889 A1 * | 2/2005 | Huang | 165/104.33 |
| 2008/0055860 A1 * | 3/2008 | Taniguchi et al. | 361/704 |
| 2008/0130221 A1 | 6/2008 | Varadarajan et al. | |
| 2010/0051243 A1 * | 3/2010 | Ali et al. | 165/104.33 |
| 2010/0079940 A1 * | 4/2010 | Mongia et al. | 361/679.49 |
| 2010/0142149 A1 * | 6/2010 | Nakamichi et al. | 361/701 |
| 2010/0214738 A1 * | 8/2010 | Wang | 361/679.48 |
| 2010/0214743 A1 * | 8/2010 | Huang et al. | 361/692 |
| 2011/0149495 A1 * | 6/2011 | Mongia et al. | 361/679.08 |
| 2012/0087093 A1 | 4/2012 | Hata | |
| 2013/0077241 A1 * | 3/2013 | Senatori | 361/694 |
| 2013/0271920 A1 | 10/2013 | Chun et al. | |

\* cited by examiner

Heat Dissipating Enhancement Feature with Touch Temperature

HINGE ASSEMBLY / DESIGN

HINGE ASSEMBLY / DESIGN

HEAT DISSIPATING APPARATUS FOR FOLDING ELECTRONIC DEVICES

CLAIM OF PRIORITY UNDER 35 U.S.C. §119

The present application claims priority to U.S. Provisional Application No. 61/711,192 entitled "Heat Dissipating Apparatus For Folding Electronic Devices", filed Oct. 8, 2012, which is hereby expressly incorporated by reference herein.

BACKGROUND

1. Field

Various features relate to a heat dissipating apparatus for folding electronic devices.

2. Background

An ultrabook is a laptop computer with a reduced/small form factor. As a result, these laptops have internal components that are tightly packaged within its case. Some of these internal components include a central processing unit (CPU), a graphics processing unit (GPU) and memory. Despite its reduced form factor (smaller compact size), such laptops are typically high performance computers with above average battery life. However, one of the drawbacks of a high performance laptop is that it generates a lot of heat (e.g., generates heat in excess of 10 W). Specifically, the high performance CPU and/or GPU of the laptop can generate a lot of heat, especially when performing data intensive operations (e.g., games, processing video).

To counter or dissipate the heat generated by the CPU and/or GPU, a laptop may include a cooling fan. The cooling fan will circulate air in the laptop to cool the CPU and/or GPU, thereby cooling the laptop. This method of cooling the laptop is known as an active cooling method. The drawback of this active cooling method is that the cooling fan consumes energy from the battery, thus limiting the battery life of the laptop. Another drawback is that cooling fans make noise (even the ones that are "silent"). In addition, cooling fans may not be practical in a small form factor computer, as they occupy a relatively large space in the computer.

Therefore, there is a need for an improved method and design for dissipating heat from a laptop or any electronic device without having to use any energy from a battery. Ideally, such a method and design can be implemented in a small form factor electronic device.

SUMMARY

Various apparatus and methods described herein provide a heat dissipating apparatus for folding electronic devices.

In a first example, a folding electronic device that includes a base portion, a cover portion and a coupler. The base portion includes a region configured to generate heat. The cover portion includes a display screen, a heat dissipating component, and a thermally insulating component. The heat dissipating component is coplanar to the display screen. The thermally insulating component is coplanar to the display screen. The thermally insulating component is located between the display screen and the heat dissipating component. The coupler is for thermally coupling the base portion to the cover portion. The coupler includes a first component and a second component. The first component is coupled to the region configured to generate heat. The second component is coupled to the heat dissipating component of the cover portion. The coupler provides a path for transferring heat.

According to one aspect, the region configured to generate heat may include a component configured to generate heat, such as a central processing unit (CPU) and/or a graphics processing unit (GPU). The coupler may include an outer cylinder and an inner cylinder. The inner cylinder may be positioned inside the outer cylinder. The coupler may also include a conductive material between the outer cylinder and the inner cylinder. In addition, the coupler may include a pin that has a fiber matrix.

According to another aspect, the second component is part of the heat dissipating component, while the in yet another aspect, the second component is a separate component from the heat dissipating component.

In a second example, a folding electronic device includes a base portion, a cover portion, and a coupler. The base portion includes a region configured to generate heat. The cover portion includes a display screen and a heat dissipating component. The heat dissipating component is coplanar to the display screen. The heat dissipating component includes a surface component that has several protrusions and several slots that increase the surface area of the surface component. The protrusions and the slots are configured to increase possible heat that can be dissipated from the cover portion to an external environment. The coupler is for thermally coupling the base portion to the cover portion. The coupler includes a first component and a second component. The first component is coupled to the region configured to generate heat. The second component is coupled to the heat dissipating component of the cover portion. The coupler provides a path for transferring heat.

According to one aspect, a portion of at least some of the protrusions from the protrusions includes a thermally insulating material having a lower $(k*\rho*C_p)$ value compared to human skin.

According to another aspect, the surface component is a separate component from the heat dissipating component, while in yet another aspect, the surface component is part of the heat dissipating component.

A third example provides a method for manufacturing a folding electronic device that includes a heat dissipating apparatus. The method couples a first conductive plate to a region configured to generate heat. The region is part of a base portion of the folding electronic device. The method couples a thermally insulative component to a display screen of a cover portion of the folding electronic device. The method couples a second conductive plate to the thermally insulative component. The method couples the base portion to the cover portion via a hinge. The hinge includes the first and second conductive plates. The hinge provides a path for heat emanating from the region in the base portion to dissipate.

According to one aspect, the thermally insulative component provides thermal insulation of the display screen from the heat being conducted by the second conductive plate. In some implementations, the region configured to generate heat includes a component configured to generate heat.

A fourth example provides a method for manufacturing a folding electronic device that includes a heat dissipating apparatus. The method couples a first conductive plate to a region configured to generate heat. The region is part of a base portion of the folding electronic device. The method couples a surface component to a second conductive plate. The surface component includes a heat dissipating enhancement feature that has several protrusions and several slots. The method couples the second conductive plate to a display screen of a cover portion of the folding electronic device. The method couples the base portion to the cover portion via a hinge. The hinge includes the first and second conductive plates. The hinge provides a path for heat emanating from the region in the base portion to dissipate from the cover portion including the heat dissipating enhancement feature.

According to one aspect, the region configured to generate heat includes a component configured to generate heat. In some implementations, a portion of at least some of the protrusions includes a thermally insulating material having a lower $(k*\rho*C_p)$ value compared to human skin.

A fifth example provides an apparatus that includes base portion, a cover portion, and a means for thermally coupling the base portion to the cover portion. The means for thermally coupling provides a path for transferring heat. The base portion includes a region configured to generate heat. The cover portion includes a means for display, a means for dissipating heat, and a means for thermally insulating the means for display from heat.

According to one aspect, the means for thermally insulating the means for display from heat includes a means for preventing heat from the means for dissipating heat from dissipating towards the means for display.

According to another aspect, the base portion further includes a means for dissipating heat from the region configured to generate heat. In some implementations, the base portion also includes a means for dissipating heat through convection to an external environment. The means for dissipating heat through convection to the external environment coupled to the means for dissipating heat from the region configured to generate heat.

A sixth example provides an apparatus that includes a base portion, a cover portion, and a means for thermally coupling the base portion to the cover portion. The means for thermally coupling provides a path for transferring heat. The base portion includes a region configured to generate heat. The cover portion includes a means for display, a means for dissipating heat, and a means for enhancing heat dissipation from the means for dissipating heat. The means for enhancing heat dissipation includes several protrusions and several slots. The protrusions and the slots are configured to increase possible heat that can be dissipated from the means for dissipating heat to an external environment.

According to one aspect, a portion of at least some of the protrusions from the protrusions includes a thermally insulating material.

DRAWINGS

Various features, nature and advantages may become apparent from the detailed description set forth below when taken in conjunction with the drawings in which like reference characters identify correspondingly throughout.

DETAILED DESCRIPTION

Figure 1A:
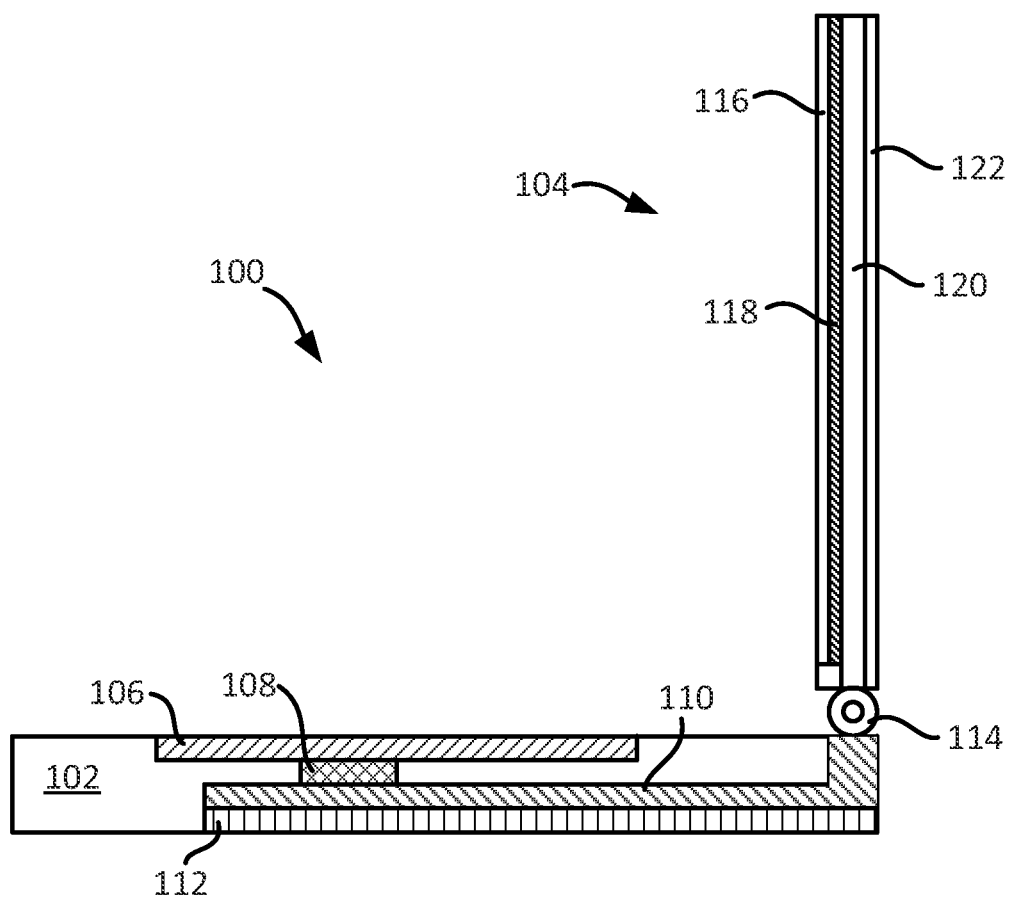
FIG. 1A illustrates a side view of a folding electronic device with a heat dissipating apparatus.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some exemplary embodiments of this disclosure pertain to a folding electronic device that includes a base portion, a cover portion and a coupler. The base portion includes a region configured to generate heat. The cover portion includes a display screen, a heat dissipating component, and a thermally insulating component. The heat dissipating component is coplanar to the display screen. The thermally insulating component is coplanar to the display screen. The thermally insulating component is located between the display screen and the heat dissipating component. The coupler is for thermally coupling the base portion to the cover portion. The coupler includes a first component and a second component. The first component is coupled to the region configured to generate heat. The second component is coupled to the heat dissipating component of the cover portion. The coupler provides a path for transferring heat.

In some implementations, the heat dissipating component of the cover portion may also include a surface component that has several protrusions and several slots that increase the surface area of the surface component. The protrusions and the slots are configured to increase possible heat that can be dissipated from the cover portion to an external environment.

In some implementations, the coupler may provide a path for transferring heat from the region configured to generate heat in the base portion to the cover portion so that at least some of the heat from the region configured to generate heat can dissipate through the cover portion.

Exemplary Heat Dissipating Apparatus

One method for cooling a component in an electronic device (e.g., laptop) is to use heat transfer based on conduction. In such an approach, components that generate heat and/or are configured to generate heat are coupled to components and/or materials that can conduct heat away from the component configured to generate heat (e.g., CPU, GPU) and/or region configured to generate heat (e.g., heat generating region). The region configured to generate heat may include the component configured to heat (e.g., heat generating component such as a semiconductor device, processor, processing circuit, central processing unit, graphics processing unit, memory device, battery, and/or power source, etc.) and/or regions adjacent to, proximate to, and/or in contact with such component. The advantage of this approach is that no battery is required to dissipate the heat.

A laptop is an example of a folding electronic device. A laptop is made up of two main portions, a base portion and a cover portion. The base portion and the cover portion are pivotally and thermally coupled together through a hinge/hinge assembly. The base portion is where the keyboard and the pad are typically located. The cover portion is where the display screen or screen (e.g., LCD) is located. In a standard laptop configuration, the CPU and/or GPU are located in the base portion of the laptop. Specifically, the CPU and/or GPU are encased in the base portion, usually underneath the keyboard.

FIG. 1A illustrates a side view of a folding electronic device (e.g., laptop) that includes a heat dissipating apparatus. For purpose of clarity, not all components of the electronic device are shown.

As shown in FIG. 1A, the electronic device 100 includes a base portion 102 and a cover portion 104. The base portion 102 encapsulates a printed circuit board (PCB) 106, a central processing unit (CPU) 108, a base conductive plate 110 and a base surface component 112. The CPU 108 is coupled to the PCB 106 and the base conductive plate 110. The base surface component 112 is coupled to the base conductive plate 110. In some implementations, the base surface component 112 is part of the outer surface of the base portion 102. As further shown in FIG. 1A, the base portion 102 is coupled to the cover portion 104 through the hinge 114.

The cover portion 104 of the electronic device 100 includes a display screen 116, an insulative component 118, a cover conductive plate 120, and a cover surface component 122. The display screen 116 may be a Liquid Crystal Display (LCD) display screen in some implementations. The insulative component 118 may be an insulative layer/sheet. The insulative component 118 is coupled to the display screen 116 and the cover conductive plate 120. As shown in FIG. 1A, the insulative component 118 is located between the display screen 116 and the cover conductive plate 120. The cover surface component 122 is coupled to the cover conductive plate 120. The display screen 116, the insulative component 118, the cover conductive plate 120, and the cover surface component 122 are co-planar to each other in some implementations. That is, in some implementations, they are parallel to each other in the cover portion 104 of the electronic device 100.

In some implementations, the heat dissipating apparatus of the electronic device 100 may include at least one of the base conductive plate 10, the base surface component 112, the hinge 114, the cover conductive plate 120 and the cover surface component 122. However, the heat dissipating apparatus may include other components as well, such as the insulative component 118. In addition, the hinge 114 may include the base conductive plate 110 and the cover conductive plate 120. That is, in some implementations, the hinge 114 is integrated with the base conductive plate 110 and the cover conductive plate 120, instead of being separate from them.

As shown in FIG. 1A, the heat dissipating apparatus of the electronic device 100 is configured and adapted to dissipate heat generated from a component configured to generate heat (e.g., the CPU 108) in the base portion 102 and/or a region configured to generate heat of the base portion 102 that includes a component configured to generate heat (e.g., heat generating component), through the base portion 102 and/or the cover portion 104 of the electronic device 100.

Figure 1B:
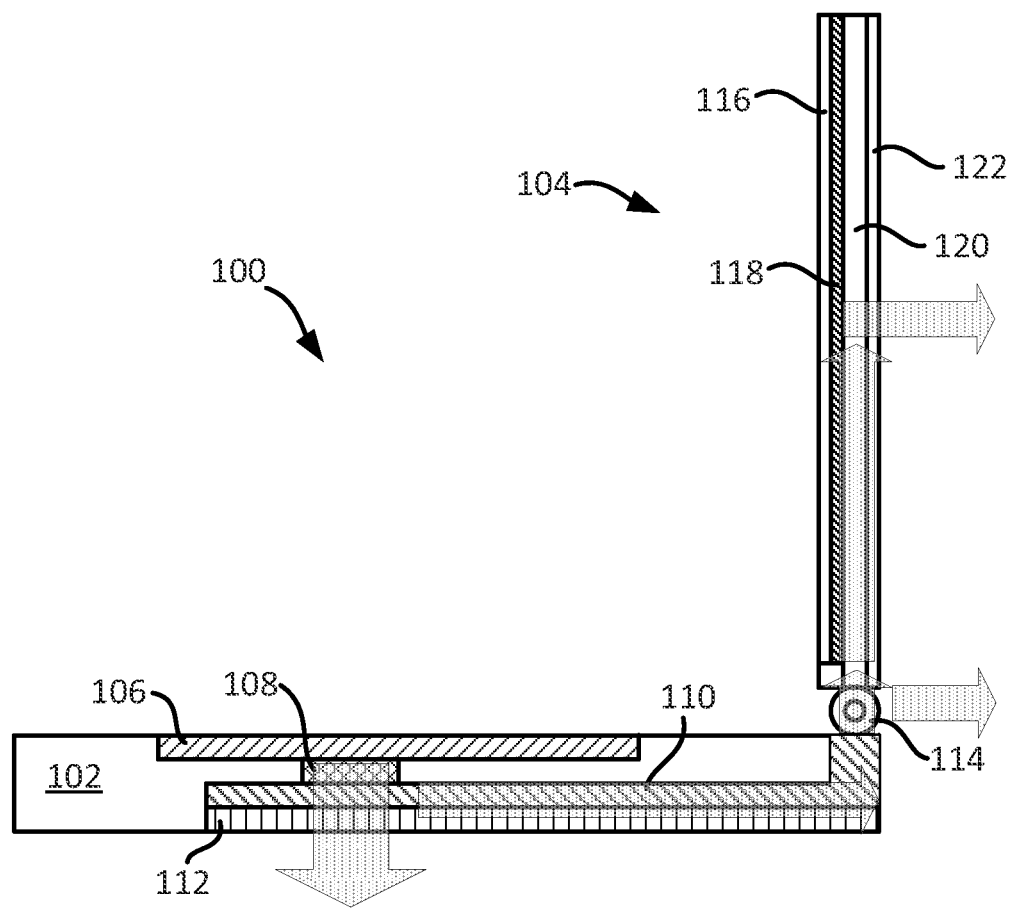
FIG. 1B illustrates the heat path from a heat-generating region in a base portion of a folding electronic device with a heat dissipating apparatus.

FIG. 1B conceptually illustrates how and where heat from a component configured to generate heat and/or region configured to generate heat that includes the component configured to generate heat, may be dissipated. FIG. 1B is similar to FIG. 1A, except that FIG. 1B illustrates the possible heat paths of heat that is generated from a component configured to generate heat (e.g., the CPU 108). The heat paths shown are not intended to show all possible heat paths, but are merely an illustration of at least some of the possible heat paths. As shown in FIG. 1B, the heat from the CPU 108 (heat source or heat generating component) may conduct to the base conductive plate 110 and dissipate through the base surface component 112. Once the heat reaches the base surface component 112, the heat may be dissipated through convective heat transfer and/or conductive heat transfer.

The heat from a region configured to generate heat or a component configured to generate heat in the base portion 102 of the electronic device 100 may also dissipate through the cover portion 104 of the electronic device 100. For example, as shown in FIG. 1B, the heat from the CPU 108 may also conduct to the base conductive plate 110, the hinge 114 and the cover conductive plate 120 and dissipate through the cover surface component 122, where heat may dissipate through convective heat transfer to an external environment. In addition, the heat may also dissipate through the hinge 114. In some implementations, the heat from the CPU 108 may also dissipate through the PCB 106 (which may be coupled to the upper surface of the base portion 102 of the electronic device 100).

The above exemplary configuration of the heat dissipating apparatus has many advantages. One, there is no energy or power required to dissipate the heat, thereby saving energy. Second, by utilizing more area of the electronic device (e.g., laptop), heat may be dissipated much more efficiently and at a higher rate. Third, since electronic devices may be rested on a person's lap and some of the heat is dissipated through the cover portion 104 of the electronic device 100 instead of the base portion 102 of the electronic device 100, a user or person is less likely to be injured (e.g., burnt) by the electronic device when the electronic device is rested on them (or at least feels less discomfort). Fourth, the above configuration preserves the small form factor of the electronic device while efficiently dissipating heat away from the region configured to generate heat and/or component configured to generate heat.

Since the display screen 116 of the cover portion 104 may be sensitive to heat, the insulative component 118 is positioned between the display screen 116 and the cover conductive plate 120 to prevent conducted heat from affecting the display screen 116. Specifically, the insulative component 118 is a thermally insulative component that has a low thermal conductivity (low enough to be considered a thermal insulator to a person of ordinary skill in the art). Different embodiments may use different materials for the insulative component 118. For example, the insulative component 118 may be a High Density Polyethylene (HDPE) sheet, an expanded polystyrene foam sheet, an epoxy, an insulating tape and/or plastic bands. As a result, the insulative component 118 provides thermal insulation of the display screen 116 from heat being conducted by the cover conductive plate 120. This effectively causes a majority or substantially all of the heat being conducted by the cover conductive plate 120 to dissipate away from the display screen 116 and towards the cover surface component 122 and into the external environment. Thus, in some implementations, heat that is dissipated by the cover portion 104 is mostly, substantially, or entirely dissipated from the back side of the cover portion 104 (side with the cover surface component 122), instead of the front side of the cover portion 104 (side with the display screen 116).

This is beneficial and advantageous because not only is heat dissipating away from the display screen 116 (thus preventing damage to the display screen 116 due to excessive heat), but heat is also dissipating away from a user using the electronic device 100 (thus reducing discomfort of the user due to heat emanating from the electronic device). In some implementations, heat may also dissipate from the side of the cover portion 104. However, as discussed above, even if heat is dissipating from the side of the cover portion 104, a majority of the heat being dissipated from the cover portion 104 is from the back of the cover portion 104 of the electronic device 100.

In some implementations, the base surface component 112 and the cover surface component 122 are components that are designed to increase heat dissipation. In some implementations, the base surface component 112 of the base portion 102 and/or the cover surface component 122 of the cover portion 104 may have a heat dissipating enhancement feature (e.g., fins), which will be described below with reference to FIGS. 4-5. However, before describing the heat dissipating enhancement feature, the heat dissipating apparatus of the electronic device will be further described.

Figure 2A:
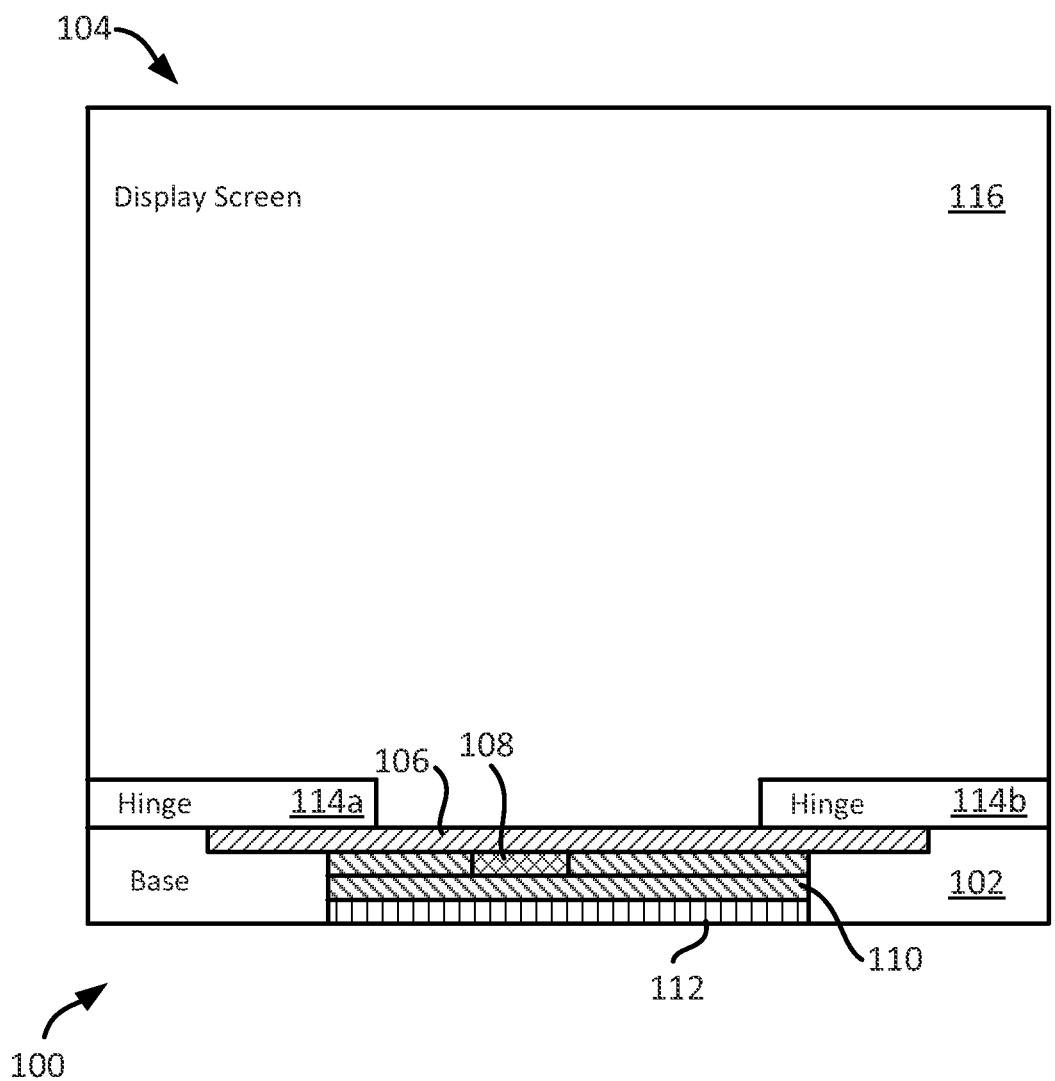
FIG. 2A illustrates a front view of a folding electronic device with a heat dissipating apparatus.

FIG. 2A illustrates a front view of the electronic device 100 of FIG. 1A. For purposes of clarity, not all components of the electronic device 100 are shown. FIG. 2A illustrates that the electronic device 100 includes the base portion 102 and the cover portion 104. The base portion 102 encapsulates the printed circuit board (PCB) 106, the central processing unit (CPU) 108, the base conductive plate 110 and the base surface component 112. The CPU 108 is coupled to the PCB 106 and the base conductive plate 110. The base surface component 112 is coupled to the base conductive plate 110. As shown in FIG. 2A, the base portion 102 is coupled to the cover portion 104 through the hinges 114*a-b*. In some implementations, the hinges 114*a-b* may extend from one end to another of the electronic device 100 to enhance/increase the heat transfer from the base portion 102 to the cover portion 104 of the electronic device 100.

Figure 2B:
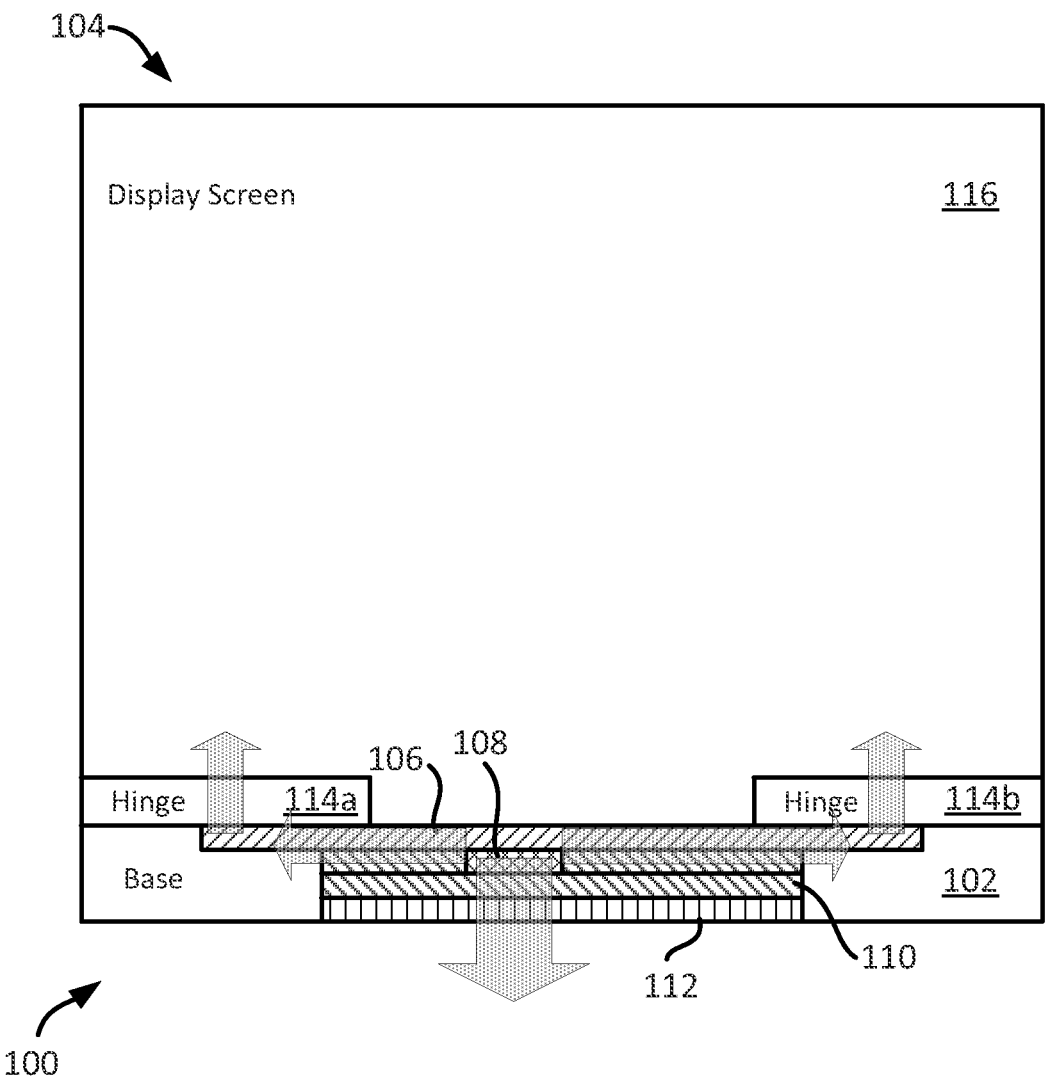
FIG. 2B illustrates the heat path from a heat-generating region in a base portion of a folding electronic device with a heat dissipating apparatus.

FIG. 2B conceptually illustrates how and where heat from a component configured to generate heat (e.g., CPU 108) and/or region configured to generate heat that includes a component configured to generate heat, may be dissipated. FIG. 2B is similar to FIG. 2A, except that FIG. 2B illustrates the possible heat paths of heat that is generated from the component configured to generate heat (e.g., CPU 108) and/or region configured to generate heat that includes the component configured to generate heat. The heat paths are not intended to show all possible heat paths, but are merely an illustration of at least some of the possible heat paths.

As shown in FIG. 2B, the heat from the CPU 108 (heat source) may conduct to the base conductive plate 110 and dissipate through the base surface component 112 (where heat may be dissipated by convective heat transfer to an external environment). The heat from the CPU 108 may also conduct to the base conductive plate 110, the hinges 114*a-b* and dissipate through the cover portion 104 of the electronic device 100. In addition, the heat may also dissipate through the hinges 114*a-b* and through the PCB 106.

Figure 3A:
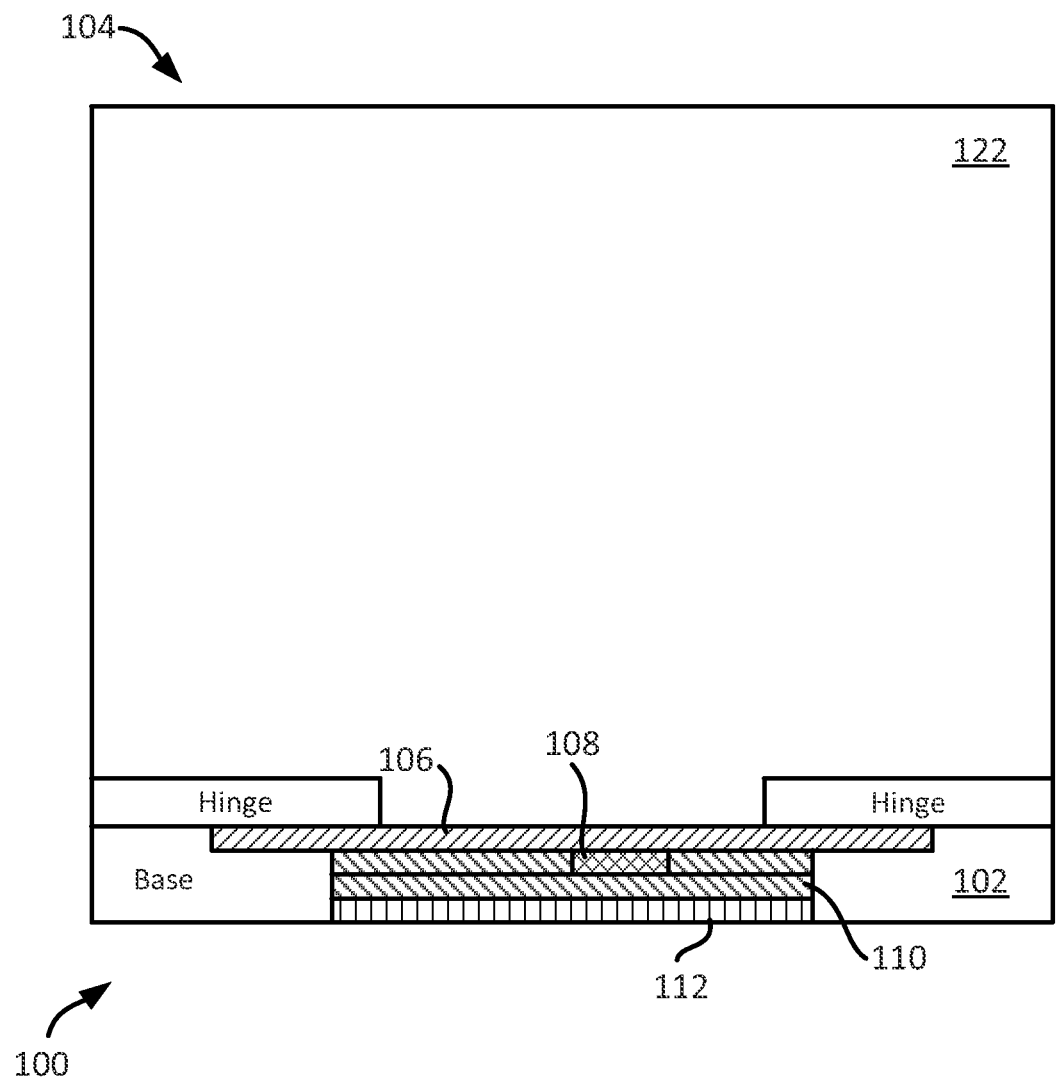
FIG. 3A illustrates a back view of a folding electronic device with a heat dissipating apparatus.

FIG. 3A illustrates a back view of the electronic device 100 of FIG. 1A. For purposes of clarity, not all components of the electronic device 100 are shown. FIG. 3A illustrates that the electronic device 100 includes the base portion 102 and the cover portion 104. The base portion 102 encapsulates the printed circuit board (PCB) 106, the central processing unit (CPU) 108, the base conductive plate 110 and the base surface component 112. The CPU 108 is coupled to the PCB 106 and the base conductive plate 110. The base surface component 112 is coupled to the base conductive plate 110.

Figure 3B:
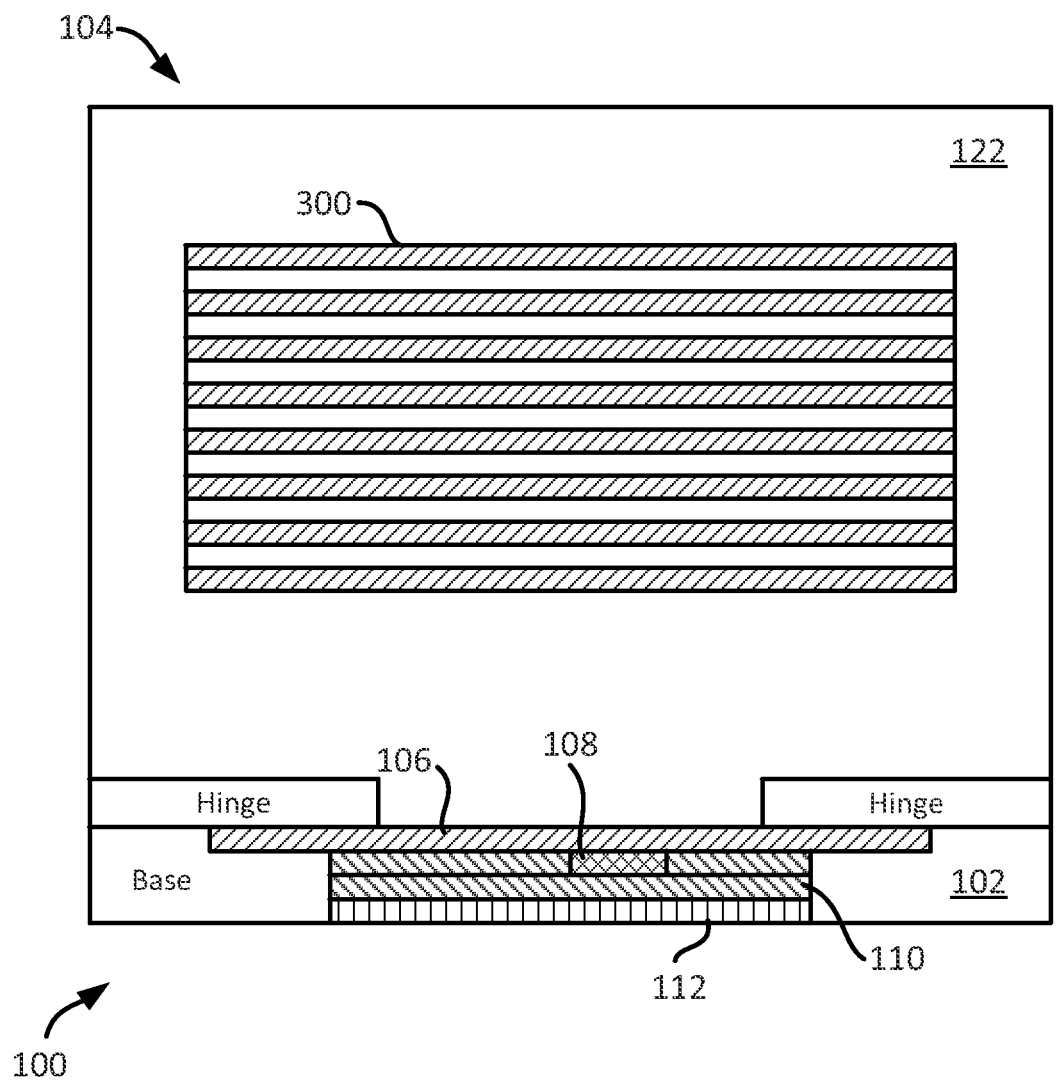
FIG. 3B illustrates a back view of a folding electronic device with a heat dissipating apparatus that includes a heat dissipating enhancement feature.

FIG. 3B illustrates a back view of the electronic device 100 of FIG. 1A. For the purposes of clarity, not all components of the electronic device 100 are shown. FIG. 3B is similar to FIG. 3A, except that FIG. 3B illustrates a cover portion 104 of an electronic device 100 that also includes a heat dissipating enhancement feature 300. The heat dissipating enhancement feature 300 is a feature that allows a heat dissipating apparatus to increase the amount of heat that is dissipated. This enhancement may be achieved by effectively increasing the surface area of the surface component 122. This increase in surface area allows more heat to be dissipated than in the electronic device configuration of FIG. 3A. FIG. 3B illustrates that the heat dissipating enhancement feature 300 covers a portion of the cover portion 104. However, in some implementations, the heat dissipating enhancement feature 300 may cover the entire cover portion 104. Having provided an overview of a heat dissipating enhancement feature, a more detailed description of a heat dissipating enhancement feature will be further described below. However, before describing the heat dissipating enhancement feature, a top view of an implementation of a base portion of a folding electronic device will first be described.

Figure 4:
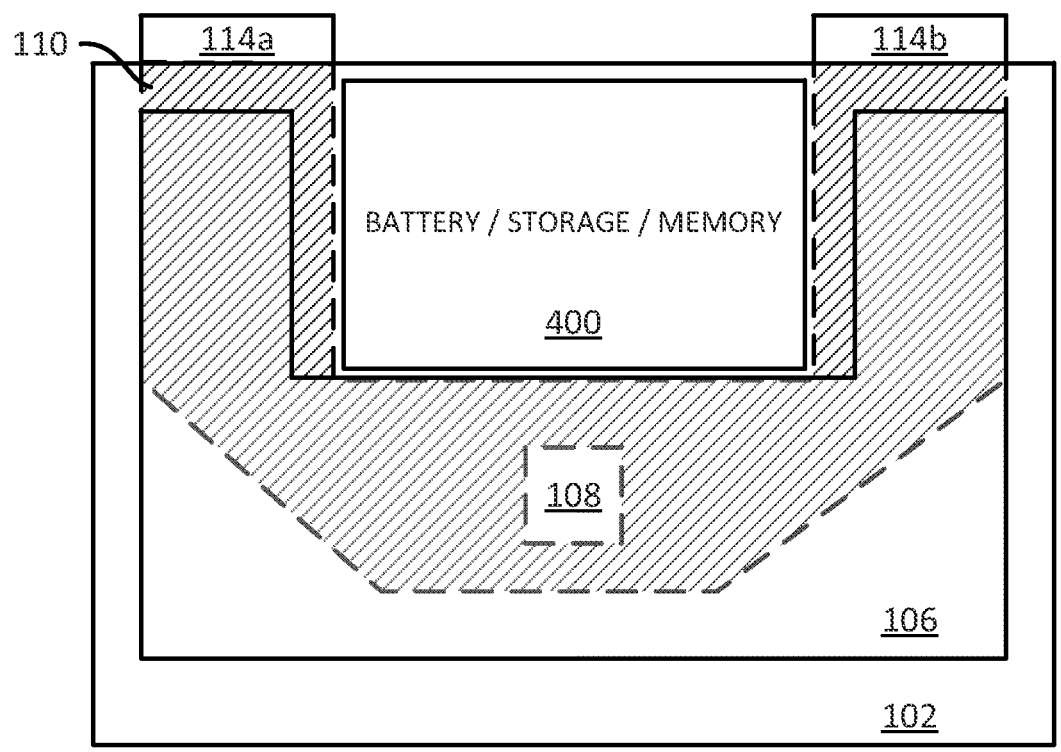
FIG. 4 illustrates a top view of a base portion of a folding electronic device with a heat dissipating apparatus.

FIG. 4 illustrates a top view of a base portion of a folding electronic device. As shown in FIG. 4, the base portion 102 includes the PCB 106, the CPU 108, and the base conductive plate 110. The base conductive plate 110 is illustrated as the shaded area having a U-shape form. On top of the base conductive plate 110 is the CPU 108. On top of both the CPU 108 and the base conductive plate 110 is the PCB 106. The PCB 106 also has a U-shape form, although, the form of the PCB 106 is slightly different than the base conductive plate 110. Moreover, the form of the PCB 106 and the base conductive plate 110 may be any shape.

The base conductive plate 110 is coupled to the hinges 114*a-b*. As shown in FIG. 4, the hinges 114*a-b* are located outside of the base portion 102. However, in some implementations, the hinges 114*a-b* may be located partially or fully in the base portion 102. In addition, the hinges 114*a-b* may extend the entire width of the base portion 102.

As further shown in FIG. 4, the PCB 106, the CPU 108 and the base conductive plate 110 are configured and arranged in the base portion 102 so as to create an open space 400 (e.g., void) in the base portion 102 for storing other components of the folding electronic device. For example, the open space 400 in the base portion 102 may be used to store a battery, a storage device (e.g., hard drive, solid state drive), and/or memory (e.g., Dynamic Random Access Memory (DRAM)).

Having described in detail a heat dissipating apparatus from different views, a detailed description of a heat dissipating enhancement feature will now be described below.

Exemplary Heat Dissipating Enhancement Feature

Figure 5A:
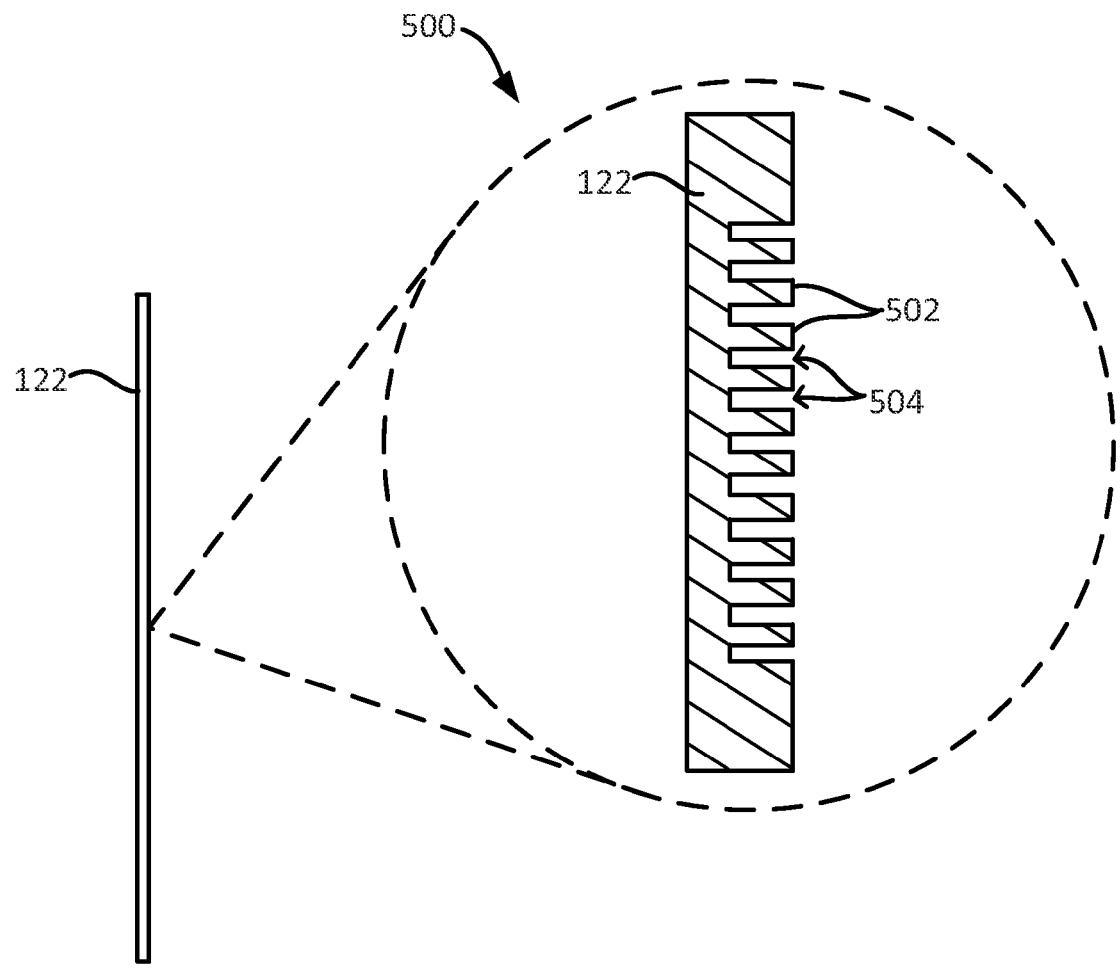
FIG. 5A illustrates a cross-sectional view of a heat dissipating enhancement feature.

FIG. 5A illustrates an example of a heat dissipating enhancement feature for a portion of a surface component (e.g., base surface component 112, cover surface component 122). Specifically, FIG. 5A illustrates a cross-sectional view of a heat dissipating enhancement feature for the cover surface component 112 of the cover portion 104. However, the heat dissipating enhancement feature 500 may also be implemented in the base surface component 112 of the base portion 102 of the electronic device 100. In some implementations, the heat dissipating enhancement feature of FIG. 5A is the heat dissipating enhancement feature 300 of FIG. 3B.

As shown in FIG. 5A, the heat dissipating enhancement feature 500 of the surface component 112 includes several protrusions 502. The protrusions 502 are exposed externally to increase the outer surface area of the surface component 122 of the cover portion 104. That is, the protrusions 502 are exposed to an environment external to the cover portion 104, and generally form at least a portion of the surface component 122 of the cover portion 104. In essence, the protrusions 502 effectively increase the surface area of the surface component 122, which potentially increases how much heat can be dissipated from the surface component 122 through convective means to an external environment in some implementations.

As shown in FIG. 5A, the heat dissipating enhancement feature 500 is part of the surface component 122. However in some implementations, the heat dissipating enhancement feature 500 is separate from, but coupled to the surface component 122. The heat dissipating enhancement feature 500 may be implemented on the entire surface component or part of the surface component 122.

Each of the protrusions 502 may be formed by several fins (also identifiable by 502) extending from the surface component 122. Each of the protrusions 502 is separated from the other protrusions 502 by several slots 504 located between each of the protrusions 502. The slots 504 may be defined by etching and/or removing a portion of surface component 122. Although other processes may be used to define the slots 504. In some implementations, the process of defining the slots 504 also defines the protrusions 502, and/or vice versa.

The protrusions 502 may comprise any combination of sizes and shapes. For instance, the protrusions 502 may be formed with a rectangular cross-section (as shown), a triangular cross-section, an ovate cross-section, or other cross-sectional shape, as well as combinations of different shapes. Similarly, the slots 504 may be formed with any cross-sectional shapes, such as rectangular (as shown), triangular, ovate, or other shapes, as well as combinations of different shapes. Different implementations may use different sizes, shapes for the protrusions 502 and the slots 504. For example, the length of the protrusions 502 may be uniform or it may be different. Similarly, the pitch between protrusions 502 may be uniform or it may be different.

According to another feature, the heat dissipating enhancement feature 500 may further include a touch temperature feature to protect users from discomfort and/or injury when touching the heat dissipating enhancement feature 500. Such a touch temperature feature is further described below with reference to FIG. 5B.

Figure 5B:
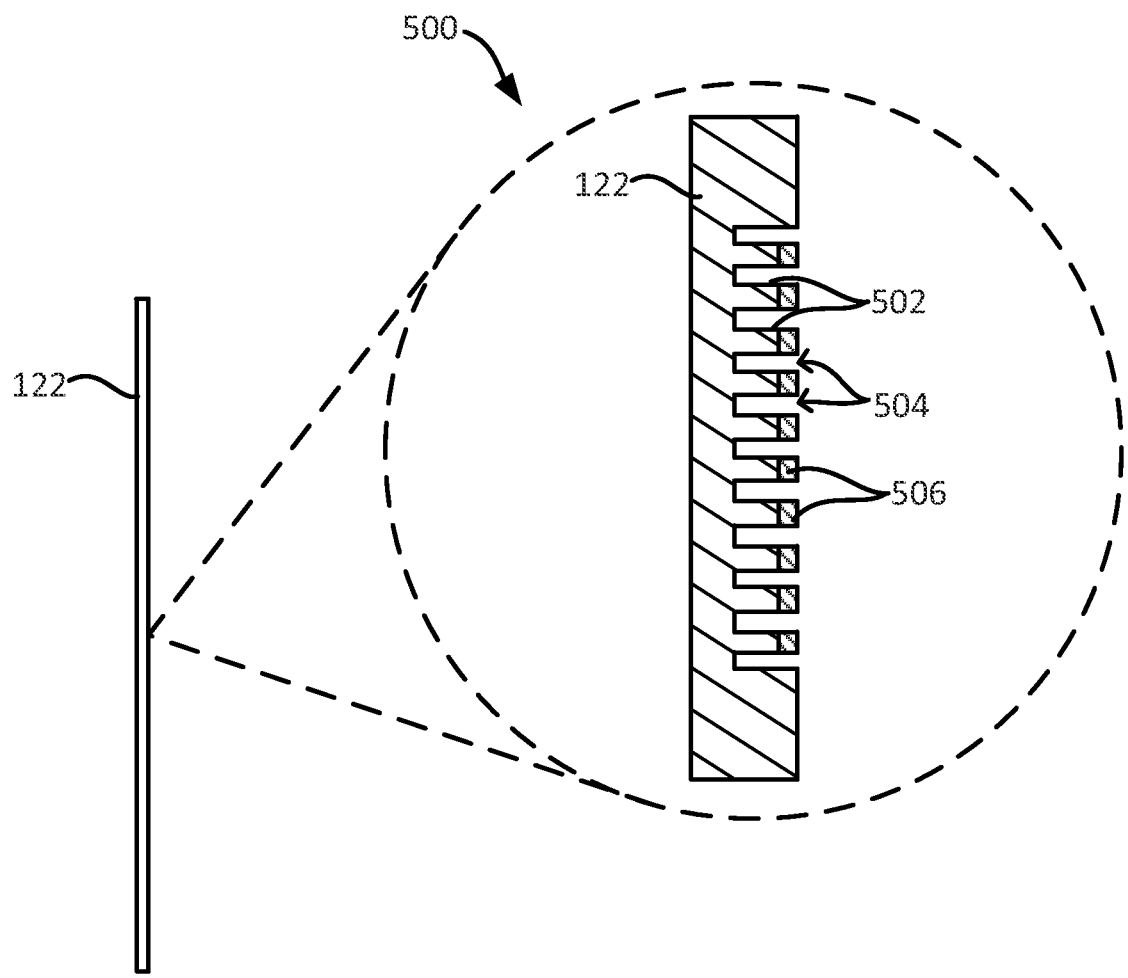
FIG. 5B illustrates a cross-sectional view of a heat dissipating enhancement feature with touch temperature feature.

As shown in FIG. 5B, the heat dissipating enhancement feature 500 may include a touch temperature feature, which may include a thermally insulating material 506 disposed (e.g., coated) on at least a tip portion of at least some of the protrusions 502. Generally speaking, the thermally insulating material 506 is a material selected to protect the user of the electronic device 100 from discomfort and/or injury (e.g., burns) that may be caused by the relatively high temperature of the surface component 122 that is exposed to the environment external to the cover portion 104. Accordingly, the thermally insulating material 506 is positioned on at least the surface or surfaces that may come into contact with a user's skin, which surface is generally referred to herein as the tip portion of the protrusions 502. Accordingly, the thermally insulating material 506 can be disposed (e.g., coated) on at least a relatively small surface of the protrusions 502. The portion of a protrusion 502 including the tip portion may vary depending on the particular orientation (e.g., horizontal and/or vertical orientation) of the protrusions 502.

The portions of the protrusions 502 that do not have a thermally insulating material 506 disposed thereon may include areas that are small enough to protect the user from exposure to the relatively high temperature of the surface component 122. Those areas of the protrusions 502 that are at least substantially free from the thermally insulating material 506 (e.g., side surfaces of the protrusions 504) can facilitate heat dissipation to the external environment.

The thermally insulating material 506 employed in various examples of the present disclosure can be selected to provide a touch temperature that is equal to, or below some predetermined threshold. In at least some examples, the predetermined threshold may be about 45° C. In other examples, the predetermined threshold may be a temperature less than, or equal to about 60° C.

The touch temperature refers to the actual temperature felt by the user's skin, as opposed to the measured temperature at the outer surfaces of the heat dissipating enhancement feature 500.

Touch temperature (T(touch) or $T_{touch}$) may be described mathematically by the equation $$T(\text{touch}) = \frac{\sqrt{(k*\rho*Cp)\text{skin}} * T(\text{skin}) + \sqrt{(k*\rho*Cp)\text{insulation}} * T(\text{surface})}{\sqrt{(k*\rho*Cp)\text{skin}} + \sqrt{(k*\rho*Cp)\text{insulation}}}.$$

The portion of the equation expressed by $k*\rho*C_p$ represent values for thermal conductivity (k), density ($\rho$), and specific heat ($C_p$) being multiplied together.

The variable ($k*\rho*C_p$) skin refers to the value of $k*\rho*C_p$ for human skin. According to at least one example, human skin can be characterized as having a thermal conductivity (k) of about 0.2 W/(m*K), a density ($\rho$) of about 1,000 kg/m$^3$, and a specific heat ($C_p$) of about 2,500 J/(kg*K). Accordingly, the product of $k*\rho*C_p$ for human skin is about 500,000 (J*W)/(m$^4$*K$^2$).

The variable T(skin) (or $T_{skin}$) refers to the temperature of human skin. This temperature can be characterized as about 36.6° C. for at least some examples.

The variable ($k*\rho*C_p$) insulation refers to the value of $k*\rho*C_p$ for the thermally insulating material 506.

The variable T(surface) (or $T_{surface}$) refers to the temperature at the outer surface of the surface component 122. This temperature is often a result of the junction temperature of the heat that is conducted from the cover conductive plate 120, which is based on the heat that is generated by a heat generating component or component configured to generate heat (e.g., CPU 108) of the electronic device 100. Accordingly, this temperature may be calculated and/or measured according to the various design constraints of the electronic device 100. According to the above equation, the touch temperature can result in a value that is lower than the measured temperature at the outer surfaces of the cover surface component 122 ($T_{surface}$).

In some examples, attaining a touch temperature at or below the predetermined threshold may be accomplished by selecting a thermally insulating material 506 that has properties for thermal conductivity (k), density ($\rho$), and specific heat ($C_p$) which, when multiplied together ($k*\rho*C_p$), result in a value that is less than the same product for human skin. As noted above, the product of $k*\rho*C_p$ for human skin may be determined to be about 500,000 (J*W)/(m$^4$*K$^2$). The thermally insulating material 506 can therefore be selected to comprise a value for k*ρ*$C_p$ that is less than about 500,000 (J*W)/(m$^4$*K$^2$).

As discussed above, the thermally insulating material 506 prevents/reduces heat that dissipates from the tip of the protrusions 502. As such, heat dissipates through portions of the protrusions 502 that are not coated with the thermally insulating material 506. Also, because of the small surface of the fin tips, the main heat transfer is achieved by the lateral surfaces (sides) of the fins.

Exemplary Coupling of Component Configured to Generate Heat

Figure 6:
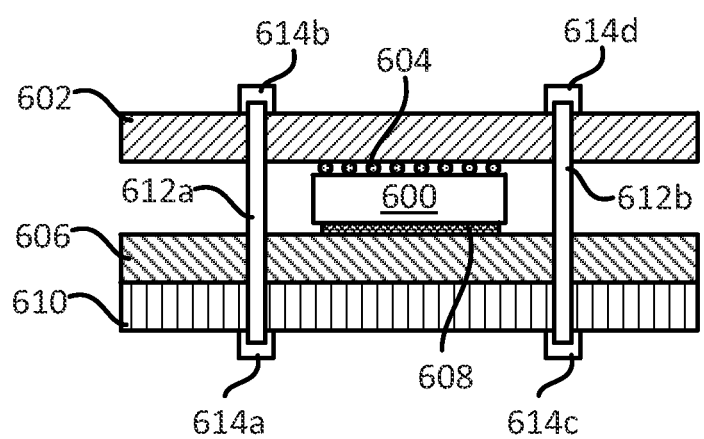
FIG. 6 illustrates a heat generating component coupled to a portion of a heat dissipating apparatus.

FIG. 6 illustrates how a heat generating component or component configured to generate heat may be coupled to a heat dissipating apparatus. As shown in FIG. 6, a CPU 600 (component configured to generate heat) is electrically coupled to a PCB 602 via a plurality of electric contact 604 (e.g., ball grid arrays).

The CPU 600 is coupled to a base conductive plate 606. A heat conductive paste 608 may be used to couple the CPU 600 and the base conductive plate 606. The heat conductive paste 608 may improve the heat transfer from the CPU 600 and the base conductive plate 606. Different implementations may use different materials for the heat conductive paste 608. For example, the heat conductive paste 608 may be a polymer with suspended lithium, silicon, carbon, and/or nickel. In addition, the heat conductive paste 608 may also be an epoxy filled with silver. The base conductive plate 606 is coupled to the base surface component 610. All of the above components may be held together by using fasteners 612*a-b* and caps 614*a-d*. The fasteners 612*a-b* and caps 614*a-d* keep the base conductive plate 606 in intimate thermal contact with the CPU 600 for the life of the assembly.

Although, not shown in FIG. 6, the PCB 602 may also be coupled to a heat conductive plate, which would increase the amount of heat being dissipated away from the CPU 600 in some implementations.

Exemplary Hinge Assemblies/Designs

Figure 7:
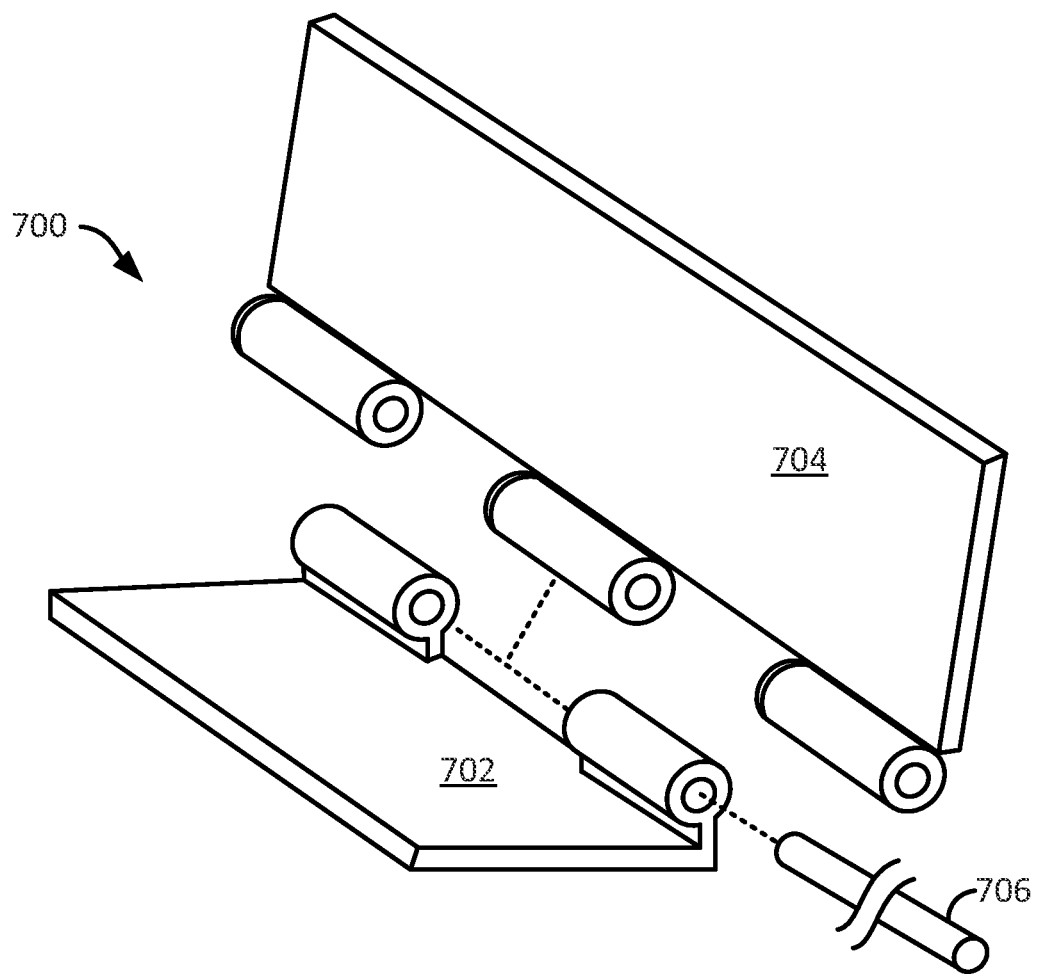
FIG. 7 illustrates a hinge assembly used in a heat dissipating apparatus.

Different implementations may use different means for coupling a base portion of an electronic device to a cover portion of the electronic device. Thus, different embodiments may use different hinge/hinge assembly designs. FIG. 7 illustrates an implementation of a heat conducting hinge assembly 700. As shown in FIG. 7, the hinge assembly 700 includes a base conductive plate 702, a cover conductive plate 704 and a pin 706. As shown in FIG. 7, the base conductive plate 702 has two slots, while the cover conductive plate 704 has three slots. However, in some implementations, the base conductive plate 702 may have more than two slots. Similarly, the cover conductive plate 704 may have more than three slots. The goal of having these slots is to have one continuous highly conductive path between the conductive plates 702-704 (which may be coupled to a region configured to generate heat and/or component configured to generate heat). The pin 706 couples the base conductive plate 702 and the cover conductive plate 704 through the slots and allows heat to transfer from the base conductive plate 702 to the cover conductive plate 704 in some implementations. The material used for the conductive plates and pins may have high thermal conductivity, thus enabling highly efficient conductive heat transfer between a base portion and a cover portion of an electronic device. In addition, some or all of the components (e.g. components exposed to an end user) of the hinge assembly 700 may be coated with a thermally insulative material to prevent touch discomfort by a user.

Figure 8:
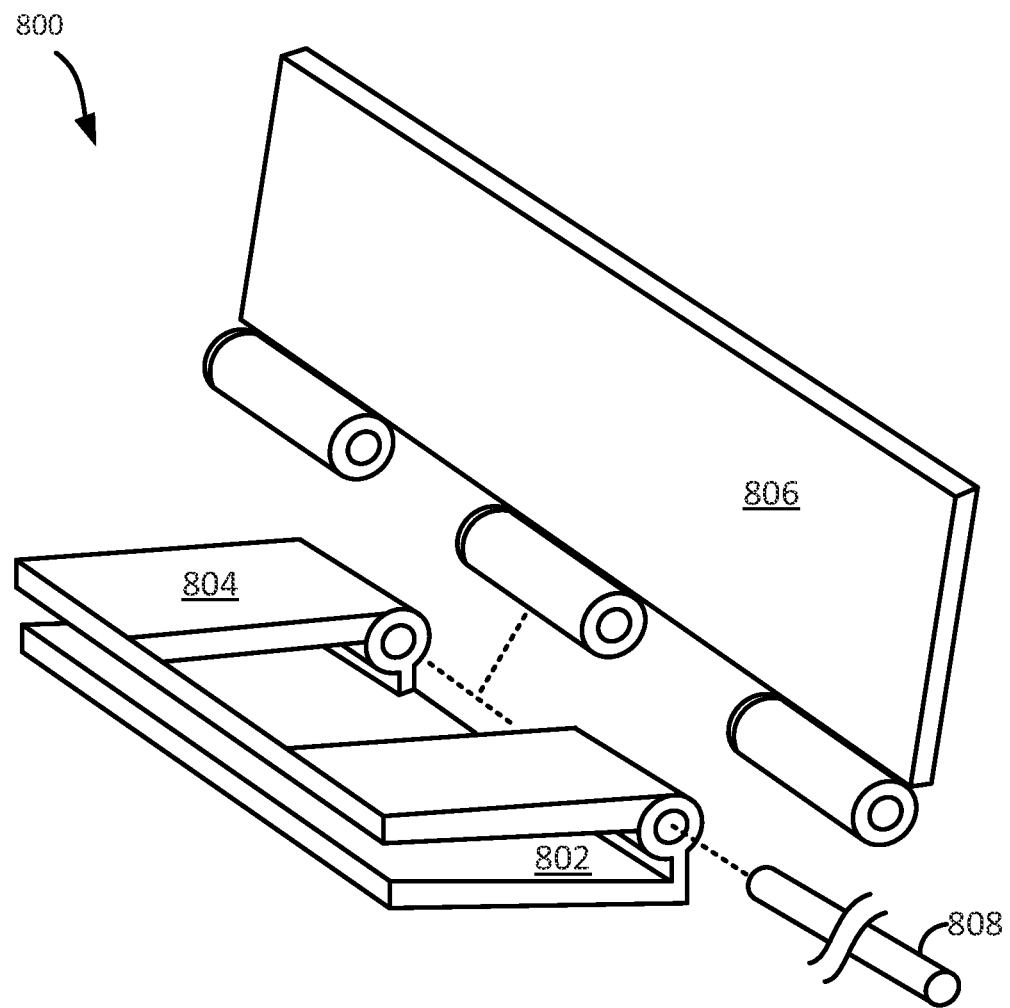
FIG. 8 illustrates another hinge assembly used in a heat dissipating apparatus.

FIG. 8 illustrates another hinge/hinge assembly design. The hinge assembly 800 of FIG. 8 is similar to the hinge assembly 700 of FIG. 7, except that the hinge assembly 800 includes two base conductive plates (an upper conductive plate and a lower conductive plate). Specifically, the hinge assembly 800 includes a first base conductive plate 802, a second base conductive plate 804, a cover conductive plate 806 and a pin 808. In this implementation, the first conductive plate 802 may be coupled with a CPU/GPU, while the second conductive plate 804 may be coupled to a PCB that is coupled to the CPU.

An advantage of hinge assembly 800 over hinge assembly 700 is that more components are coupled (directly or indirectly) to the CPU, which increases the conductive heat transfer (due to more area coupled to the CPU). Similarly, the material used for the conductive plates may have high thermal conductivity, thus enabling highly efficient conductive heat transfer between a base portion and a cover portion of an electronic device. In addition, some or all of the components of the hinge assembly 800 may be coated with a thermally insulative material to prevent touch discomfort by a user.

Figure 9:
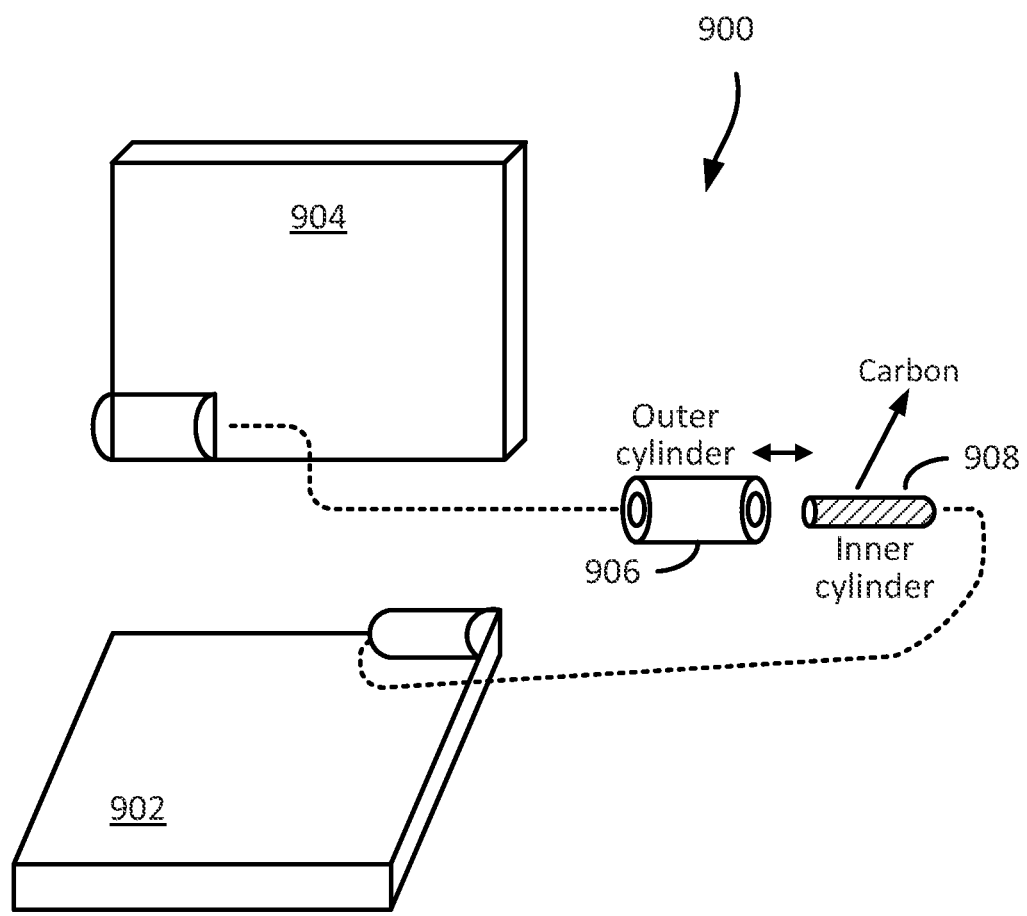
FIG. 9 illustrates yet another hinge assembly used in a heat dissipating apparatus.

FIG. 9 illustrates yet another hinge/hinge assembly design. As shown in this FIG. 9, the hinge assembly 900 includes a base conductive plate 902, a cover conductive plate 904, an outer cylinder 906, and an inner cylinder 908. The base conductive plate 902 and the cover conductive plate 904 each have a slot. Each slot is on opposite ends of each other. The outer cylinder 906 is a hollow cylindrical pin that is coupled to the slot of the cover conductive plate 904. The inner cylinder 908 is a pin with a diameter that is smaller than the diameter of the opening of the outer cylinder 906. The inner cylinder 908 is coupled to the slot of the base conductive plate 902. The inner cylinder 908 may be inserted in the outer cylinder 906. The inner cylinder 908 may be filled and/or coated with conductive materials (e.g., carbon based material). This conductive material allows for the efficient heat transfer between the outer cylinder 906 and the inner cylinder 908, which ultimately leads to efficient/better heat transfer between the base conductive plate 902 and the cover conductive plate 904.

Figure 10:
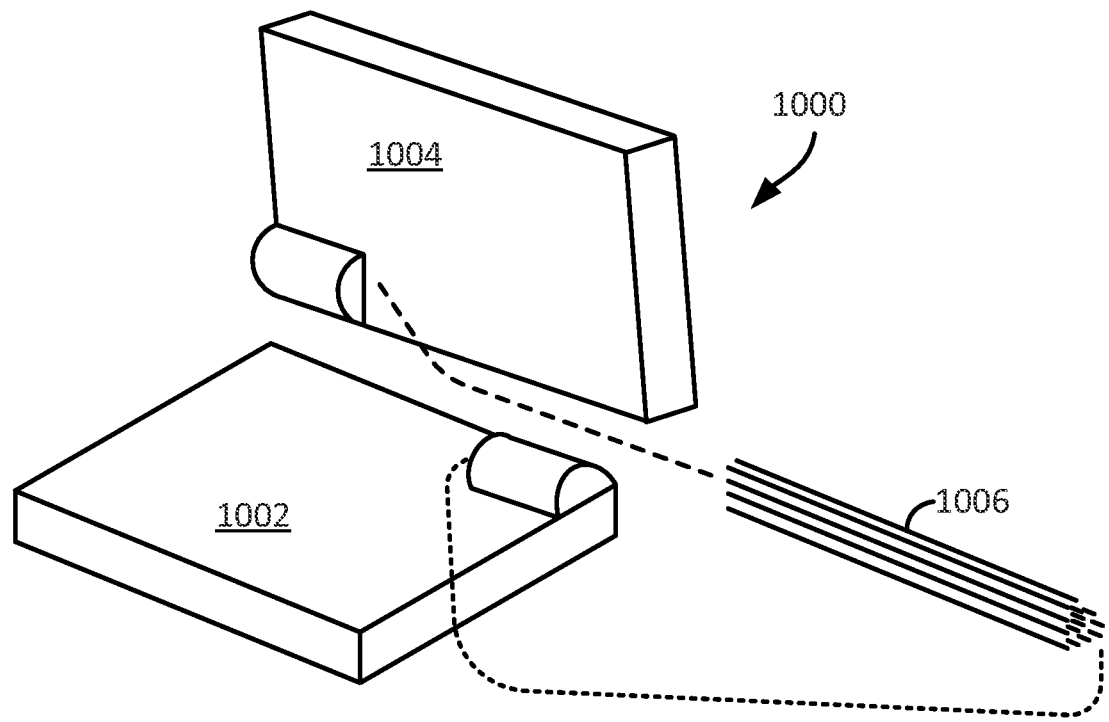
FIG. 10 illustrates a hinge assembly used in a heat dissipating apparatus.

FIG. 10 illustrates yet another hinge/hinge assembly design. As shown in FIG. 10, the hinge assembly 1000 includes a base conductive plate 1002, a cover conductive plate 1004, and a pin 1006. The base conductive plate 1002 and the cover conductive plate 1004 each have a slot. Each slot is on opposite ends of each other. The pin 1006 is made of heat conductive fibers that are bundled in a flexible matrix. The fibers may be loosely arranged and based on carbon materials. The flexible matrix may bend when the electronic device opens and close, which enhances the reliability of the hinge design since the material undergoes torsional stresses when the electronic device opens and closes.

Exemplary Method for Providing a Heat Dissipating Apparatus

Figure 11:
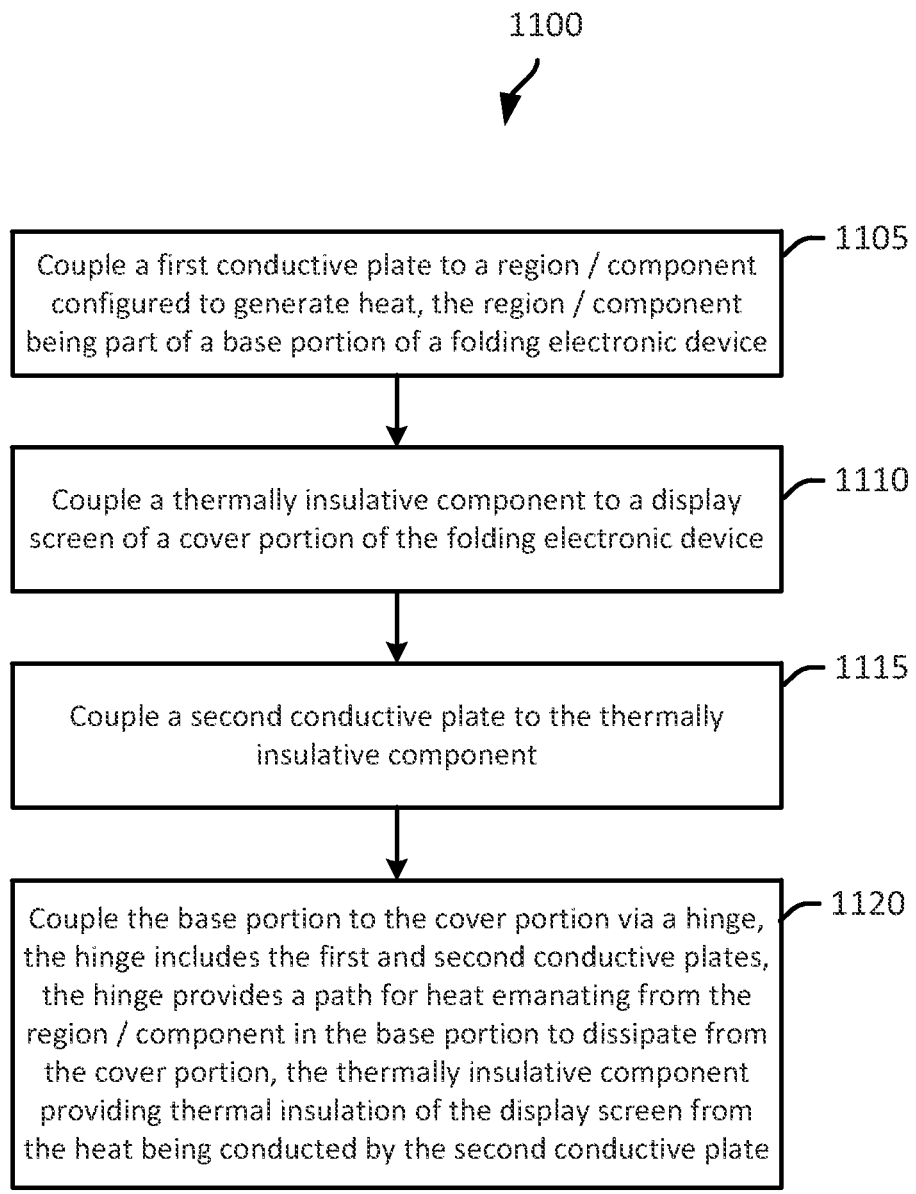
FIG. 11 illustrates a flow diagram for making a heat dissipating apparatus.

FIG. 11 illustrates a method for providing a heat dissipating apparatus in some implementations. As shown in FIG. 11, the method couples (at 1105) a first conductive plate to a region configured to generate heat. The region may be part of a base portion of a folding electronic device. In some implementations, coupling (at 1105) the first conductive plate to a region configured to generate heat may include coupling the first conductive plate to a component configured to generate heat and/or coupling the first conductive plate to a region that includes a component configured to generate heat. The component that is configured to generate heat may be a central processing unit (CPU) or a graphics processing unit (CPU) in some implementations.

Next, the method couples (at 1110) a thermally insulative component to a display screen of a cover portion of the folding electronic device. The thermally insulative component may be coupled to the display screen such that the thermally insulative component is coplanar to the display screen. The thermally insulative component may have a low thermal conductivity. The method then couples (at 1115) a second conductive plate to the thermally insulative component. The second conductive plate may be coplanar to both the thermally insulative component and the display screen.

Next, the method couples (at 1120) the base portion of the folding electronic device to the cover portion of the electronic device via a hinge, which provides a path for heat emanating from the region/component in the base portion to dissipate from the cover portion and away from the display screen of the cover portion. The hinge may be defined by the first and second conductive plates in some embodiments. The insulative component provides thermal insulation of the display screen from the heat being conducted by the second conductive plate. In some implementations, providing thermal insulation to the display screen includes reducing or preventing heat from conducting/transferring to the display screen.

As described above, some implementations of the heat dissipating apparatus also includes a heat dissipating enhancement feature.

Figure 12:
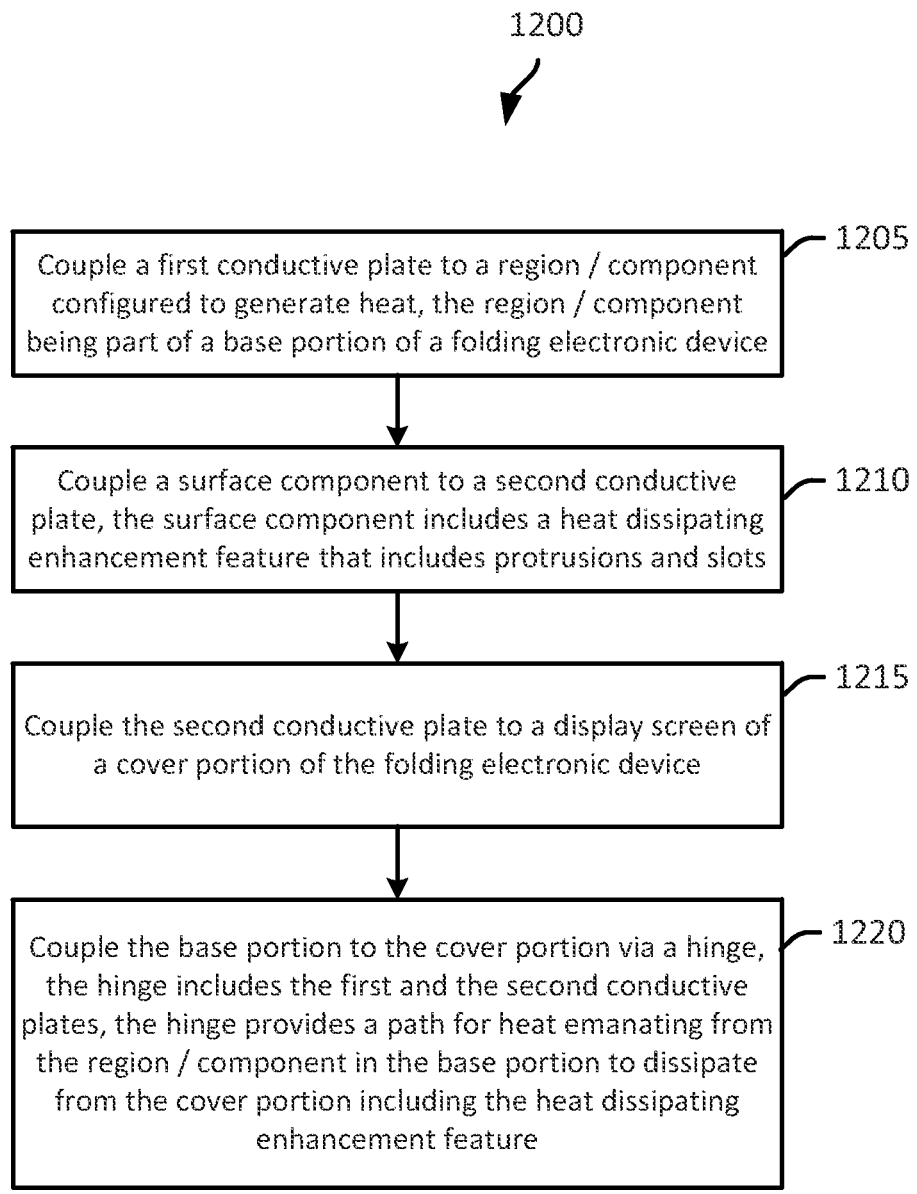
FIG. 12 illustrates a flow diagram for making another heat dissipating apparatus.

FIG. 12 illustrates a method for providing a heat dissipating apparatus with a heat dissipating enhancement feature in some implementations. As shown in FIG. 12, the method couples (at 1205) a first conductive plate to a region configured to generate heat. In some implementations, coupling (at 1205) the first conductive plate to a region configured to generate heat may include coupling the first conductive plate to a component configured to generate heat and/or coupling the first conductive plate to a region that includes a component configured to generate heat. The component may be part of a base portion of a folding electronic device. The component that is configured to generate heat may be a central processing unit (CPU) or a graphics processing unit (CPU) in some implementations.

Next, the method couples (at 1210) a surface component to a second conductive plate. The surface component may include a heat dissipating enhancement feature that potentially increases the amount of heat that the surface component can dissipate through convective means to an external environment. The heat dissipating enhancement feature may include several protrusions and slots, which increases the surface area of the surface component that is exposed to the environment. In some implementations, a portion of the protrusions (e.g., tip of the protrusion) may be coated with a thermally insulative material, which may provide touch temperature to prevent a user from discomfort and/or injury (e.g., burn) when touching the heat dissipating enhancement.

The method then couples (at 1215) the second conductive plate to a display screen of a cover portion of the folding electronic device. The second conductive plate may be coupled to the display screen such that the second conductive plate is coplanar to the display screen. In some implementations, coupling the second conductive plate also includes coupling the surface component to the display screen since the surface component is coupled to the second conductive plate.

Next, the method couples (at 1220) the base portion of the folding electronic device to the cover portion of the electronic device via a hinge, which provides a path for heat emanating from the region/component in the base portion to dissipate from the cover portion, including the heat dissipating enhancement feature. The hinge may be defined by the first and second conductive plates in some embodiments. In some implementations, the heat dissipating enhancement feature may be implemented with the thermally insulative component described in FIG. 11.

One or more of the components, steps, features, and/or functions illustrated in FIGS. 1, 2, 3, 4, 5, 6, 7, 8, 9, 10, 11 and/or 12 may be rearranged and/or combined into a single component, step, feature or function or embodied in several components, steps, or functions. Additional elements, components, steps, and/or functions may also be added without departing from the invention.

In the above examples, the component configured to generate heat is a CPU. However, the above heat dissipating apparatus and/or mechanism may be used with a GPU as well. In addition, the surface component (e.g., base surface component 112, cover surface component 122) may be integrated with its respective conductive plate. That is, the surface component and the conductive plate may be a single component. Additionally, in some implementations, the conductive plate is the external surface area of the electronic device. As such no surface component may be required. Moreover, in such instances, the heat dissipating enhancement feature may be integrated with the conductive plate (e.g., conductive plate 110, conductive plate 120).

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die.

The term "region configured to generate heat" is intended to mean a region that includes one or more component, circuit, and/or module that is configured to generate heat and/or capable of generating heat when active, on, or performing an electric operation. A component that is off and not producing any heat when off may be considered a component configured to generate heat if the component generates heat when the component is on (e.g., running). In some implementations, the "region configured to generate heat" is intended to mean a "component configured to generate heat."

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A folding electronic device, comprising:
a base portion including a region configured to generate heat;
a cover portion including:
a display screen;
a heat dissipating component parallel to and spaced apart from a rear surface of the display screen; and
a thermally insulating component configured to insulate the rear surface of the display screen from heat dissipated from the heat dissipating component, wherein the thermally insulating component is located between the rear surface of the display screen and the heat dissipating component; and
a coupler for thermally coupling the base portion to the cover portion, the coupler including a first component, a second component, and a third component, the first component coupled to the region configured to generate heat, the second component coupled to the heat dissipating component, and the third component passing through the first and second components and thermally coupling the first and second components, the coupler providing a path for transferring heat.

2. The folding electronic device of claim 1, wherein the coupler further includes an outer cylinder, wherein the third component additionally passes through an inside of the outer cylinder.

3. The folding electronic device of claim 2, wherein the coupler further includes a conductive material between the outer cylinder and the third component.

4. The folding electronic device of claim 1, wherein the third component is a pin that includes a fiber matrix.

5. The folding electronic device of claim 1, wherein the region configured to generate heat includes a component configured to generate heat that is a central processing unit (CPU).

6. The folding electronic device of claim 1, wherein the region configured to generate heat includes a component configured to generate heat that is a graphical processing unit (GPU).

7. The folding electronic device of claim 1, wherein the heat dissipating component includes a surface component that includes a plurality of protrusions and slots between protrusions, wherein the plurality of protrusions and slots is exposed to an environment external to the cover portion, wherein the plurality of protrusions and slots increase an available surface area of the heat dissipating component to increase an amount of heat that can be dissipated from the cover portion to the environment external to the cover portion.

8. The folding electronic device of claim 1, wherein the second component of the coupler includes the heat dissipating component.

9. The folding electronic device of claim 1, wherein the base portion further includes:
a base heat dissipating component positioned in the base portion coupled to the region configured to generate heat,
wherein the base heat dissipating component includes a surface component that includes a plurality of protrusions and slots between protrusions, wherein the plurality of protrusions and slots is exposed to an environment external to the base portion, wherein the plurality of protrusions and slots increase an available surface area of the base heat dissipating component to increase an amount of heat that can be dissipated from the base portion to the environment external to the base portion.

10. An apparatus, comprising:
a base portion including a region configured to generate heat;
a cover portion including:
means for display;
means for dissipating heat, wherein the means for dissipating heat is parallel to and spaced apart from a rear surface of the means for display; and
means for thermally insulating the rear surface of the means for display from heat dissipated from the means for dissipating heat, wherein the means for thermally insulating is located between the rear surface of the means for display and the means for dissipating heat; and
means for thermally coupling the base portion to the cover portion, the means for thermally coupling including a first component, a second component, and a third component, the first component coupled to the region configured to generate heat, the second component coupled to the means for dissipating heat, and the third component passing through the first and second components and thermally coupling the first and second components, wherein the means for thermally coupling provides a path for transferring heat.

11. The apparatus of claim 10, wherein the means for thermally coupling further includes an outer cylinder, wherein the third component additionally passes through an inside of the outer cylinder.

12. The apparatus of claim 11, wherein the means for thermally coupling further includes a conductive material between the outer cylinder and the third component.

13. The apparatus of claim 10, wherein the third component is a pin that includes a fiber matrix.

14. The apparatus of claim 10, further including means for enhancing heat dissipation from the means for dissipating heat.

15. The apparatus of claim 14, wherein the means for enhancing heat dissipation includes a surface having a plurality of protrusions and slots between protrusions, wherein the plurality of protrusions and slots is exposed to an environment external to the cover portion, wherein the plurality of protrusions and slots increase an available surface area of the means for dissipating heat to increase an amount of heat that can be dissipated from the cover portion to the environment external to the cover portion.

16. The apparatus of claim 15, wherein a portion of at least some of the protrusions includes a thermally insulating material having a lower $(k*\rho*Cp)$ value compared to human skin, wherein k represents thermal conductivity, $\rho$ represents density, and Cp represents specific heat.

17. The apparatus of claim 10, wherein the base portion further includes a base means for dissipating heat from the region configured to generate heat,
wherein the base means for dissipating heat includes a surface component that includes a plurality of protrusions and slots between protrusions, wherein the plurality of protrusions and slots is exposed to an environment external to the base portion, wherein the plurality of protrusions and slots increase an available surface area of the base heat dissipating component to increase an amount of heat that can be dissipated from the base portion to the environment external to the base portion.

18. A folding electronic device, comprising:
a base portion including a region configured to generate heat;
a cover portion including:
a display screen;
a heat dissipating component parallel to and spaced apart from a rear surface of the display screen, wherein the heat dissipating component includes a surface component that includes a plurality of protrusions and slots between protrusions, wherein the plurality of protrusions and slots is exposed to an environment external to the cover portion, wherein the plurality of protrusions and slots increase an available surface area of the heat dissipating component to increase an amount of heat that can be dissipated from the cover portion to the environment external to the cover portion; and a coupler for thermally coupling the base portion to the cover portion, the coupler including a first component and a second component, the first component coupled to the region configured to generate heat, the second component coupled to the heat dissipating component of the cover portion, the coupler providing a path for transferring heat.

19. The folding electronic device of claim 18, wherein a portion of at least some of the protrusions includes a thermally insulating material having a lower $(k*\rho*Cp)$ value compared to human skin, wherein k represents thermal conductivity, $\rho$ represents density, and Cp represents specific heat.

20. The folding electronic device of claim 18, wherein the coupler further includes an outer cylinder and an inner cylinder, the inner cylinder passing through an inside of the outer cylinder.

21. The folding electronic device of claim 20, wherein the coupler further includes a conductive material between the outer cylinder and the inner cylinder.

22. The folding electronic device of claim 18, wherein the coupler includes a pin that includes a fiber matrix.

23. The folding electronic device of claim 18, wherein the surface component is part of the heat dissipating component.

24. The folding electronic device of claim 18, wherein the surface component is separate from the heat dissipating component.

25. An apparatus, comprising:
a base portion including a region configured to generate heat;
a cover portion including:
means for display;
means for dissipating heat, the means for dissipating heat parallel to and spaced apart from a rear surface of the means for display;
means for enhancing heat dissipation from the means for dissipating heat, the means for enhancing heat dissipation including a plurality of protrusions and slots between protrusions,
wherein the plurality of protrusions and slots is exposed to an environment external to the cover portion, and increases an available surface area of the means for dissipating heat to increase an amount of heat that can be dissipated from the cover portion to the environment external to the cover portion; and
means for thermally coupling the base portion to the cover portion, wherein the means for thermally coupling provides a path for transferring heat.

26. The apparatus of claim 25, wherein a portion of at least some of the protrusions includes a thermally insulating material having a lower $(k*\rho*Cp)$ value compared to human skin, wherein k represents thermal conductivity, $\rho$ represents density, and Cp represents specific heat.

27. The apparatus of claim 25, wherein the means for thermally coupling further includes an outer cylinder and an inner cylinder, the inner cylinder passing through an inside of the outer cylinder.

28. The apparatus of claim 27, wherein the means for thermally coupling further includes a conductive material between the outer cylinder and the inner cylinder.

29. The apparatus of claim 25, wherein the means for thermally coupling includes a pin that includes a fiber matrix.

30. A method for manufacturing a folding electronic device comprising a heat dissipating apparatus, comprising:
coupling a first conductive plate to a region configured to generate heat, the region being part of a base portion of the folding electronic device;
coupling a thermally insulative component to a display screen of a cover portion of the folding electronic device;
coupling a second conductive plate to the thermally insulative component; and
coupling the base portion to the cover portion via a hinge, the hinge including the first and second conductive plates, the hinge providing a path for heat emanating from the region in the base portion to dissipate.

31. The method of claim 30, wherein, the thermally insulative component provides thermal insulation of the display screen from the heat being conducted by the second conductive plate.

32. The method of claim 30, wherein the region configured to generate heat includes a component configured to generate heat.

33. The method of claim 30, wherein the hinge includes a first outer pin and a second inner pin, the second inner pin positioned inside the first outer pin.

34. The method of claim 33, wherein the hinge further includes a conductive material between the first outer pin and the second inner pin.

35. The method of claim 30, wherein the hinge includes a pin that includes a fiber matrix.

36. The method of claim 30, further includes coupling a surface component to the second conductive plate, the surface component including a heat dissipating enhancement feature including a plurality of protrusions and a plurality of slots.

37. A method for manufacturing a folding electronic device comprising a heat dissipating apparatus, comprising:
coupling a first conductive plate to a region configured to generate heat, the region being part of a base portion of the folding electronic device;
coupling a surface component to a second conductive plate, the surface component including a heat dissipating enhancement feature including a plurality of protrusions and a plurality of slots;
coupling the second conductive plate to a display screen of a cover portion of the folding electronic device; and
coupling the base portion to the cover portion via a hinge, the hinge including the first and second conductive plates, the hinge providing a path for heat emanating from the region in the base portion to dissipate from the cover portion including the heat dissipating enhancement feature.

38. The method of claim 37, wherein the region configured to generate heat includes a component configured to generate heat.

39. The method of claim 37, wherein a portion of at least some of the protrusions from the plurality of protrusions includes a thermally insulating material having a lower $(k*\rho*Cp)$ value compared to human skin.

* * * * *